United States Patent
Rakshit et al.

(10) Patent No.: US 12,235,714 B2
(45) Date of Patent: Feb. 25, 2025

(54) AUTOMATIC ISSUE IDENTIFICATION AND PREVENTION

(71) Applicant: International Business Machines Corporation, Armonk, NY (US)

(72) Inventors: Sarbajit K. Rakshit, Kolkata (IN); Akash U. Dhoot, Pune (IN); Shailendra Moyal, Pune (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 29 days.

(21) Appl. No.: 18/147,023

(22) Filed: Dec. 28, 2022

(65) Prior Publication Data

US 2024/0220344 A1    Jul. 4, 2024

(51) Int. Cl.
| | |
|---|---|
| *G06F 11/00* | (2006.01) |
| *G05B 15/02* | (2006.01) |
| *G06F 11/07* | (2006.01) |
| *G06F 30/20* | (2020.01) |

(52) U.S. Cl.
CPC .......... *G06F 11/0703* (2013.01); *G05B 15/02* (2013.01); *G06F 30/20* (2020.01); *G05B 2219/2642* (2013.01)

(58) Field of Classification Search
CPC .................................................. G06F 11/0703
USPC ....................................................... 714/1–57
See application file for complete search history.

(56) References Cited

U.S. PATENT DOCUMENTS

| | | | |
|---|---|---|---|
| 7,657,582 B1* | 2/2010 | Cram | G06F 11/1469 707/682 |
| 7,664,849 B1* | 2/2010 | Chandler | G06F 11/0727 709/224 |
| 2005/0278575 A1* | 12/2005 | Nicholson | G06F 11/008 714/37 |
| 2011/0185220 A1* | 7/2011 | Foley | G06F 11/0733 714/2 |
| 2013/0311832 A1* | 11/2013 | Lad | H04L 41/0631 714/37 |
| 2016/0092682 A1* | 3/2016 | Adams | G06F 21/56 726/23 |
| 2016/0154712 A1* | 6/2016 | Iwasaki | G06F 11/1451 714/19 |
| 2016/0378628 A1* | 12/2016 | Nguyen | G06F 11/008 714/40 |
| 2018/0348301 A1* | 12/2018 | McKiernan | G01R 31/318342 |
| 2019/0079849 A1* | 3/2019 | Korn | G06Q 10/04 |
| 2019/0129831 A1* | 5/2019 | Goldberg | G06F 3/04847 |

(Continued)

FOREIGN PATENT DOCUMENTS

| | | |
|---|---|---|
| CN | 114311609 A | 4/2022 |
| WO | 2021037498 A1 | 3/2021 |
| WO | 2021108680 A1 | 6/2021 |

*Primary Examiner* — Sarai E Butler
(74) *Attorney, Agent, or Firm* — Intelletek Law Group, PLLC; Gabriel Daniel, Esq.

(57) ABSTRACT

A processor may receive object data associated with an object in an environment. The processor may generate one or more simulations associated with the object using the object data. The processor may analyze the one or more simulations to identify one or more potential issues associated with the object. The processor may deploy the one or more smart devices to the object to capture issue data associated the one or more potential issues.

20 Claims, 4 Drawing Sheets

(56) References Cited

U.S. PATENT DOCUMENTS

| | | | |
|---|---|---|---|
| 2019/0146864 A1* | 5/2019 | Nair | G11C 29/70 |
| | | | 714/47.2 |
| 2021/0083925 A1* | 3/2021 | Song | H04L 41/147 |
| 2021/0118242 A1* | 4/2021 | Gautam | G07C 5/006 |
| 2022/0092234 A1 | 3/2022 | Karri | |
| 2022/0217168 A1* | 7/2022 | Singh | H04L 63/1441 |
| 2022/0300363 A1* | 9/2022 | Barat | G06F 11/079 |

\* cited by examiner

AUTOMATIC ISSUE IDENTIFICATION AND PREVENTION

BACKGROUND

The present disclosure relates generally to the field of artificial intelligence, and more particularly to the field of smart devices.

Computing devices or other smart devices have evolved over time to accomplish various tasks making lives safer and easier. Such devices can be found in people's homes and workplace to assist people with some aspect of their day. As these devices have grown in popularity, so too has their usefulness and their ability to perform various tasks.

SUMMARY

Embodiments of the present disclosure include a method, computer program product, and system for managing an one or more personal devices in a smart environment.

A processor may receive object data associated with an object in an environment. The processor may generate one or more simulations associated with the object using the object data. The processor may analyze the one or more simulations to identify one or more potential issues associated with the object. The processor may deploy the one or more smart devices to the object to capture issue data associated the one or more potential issues.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
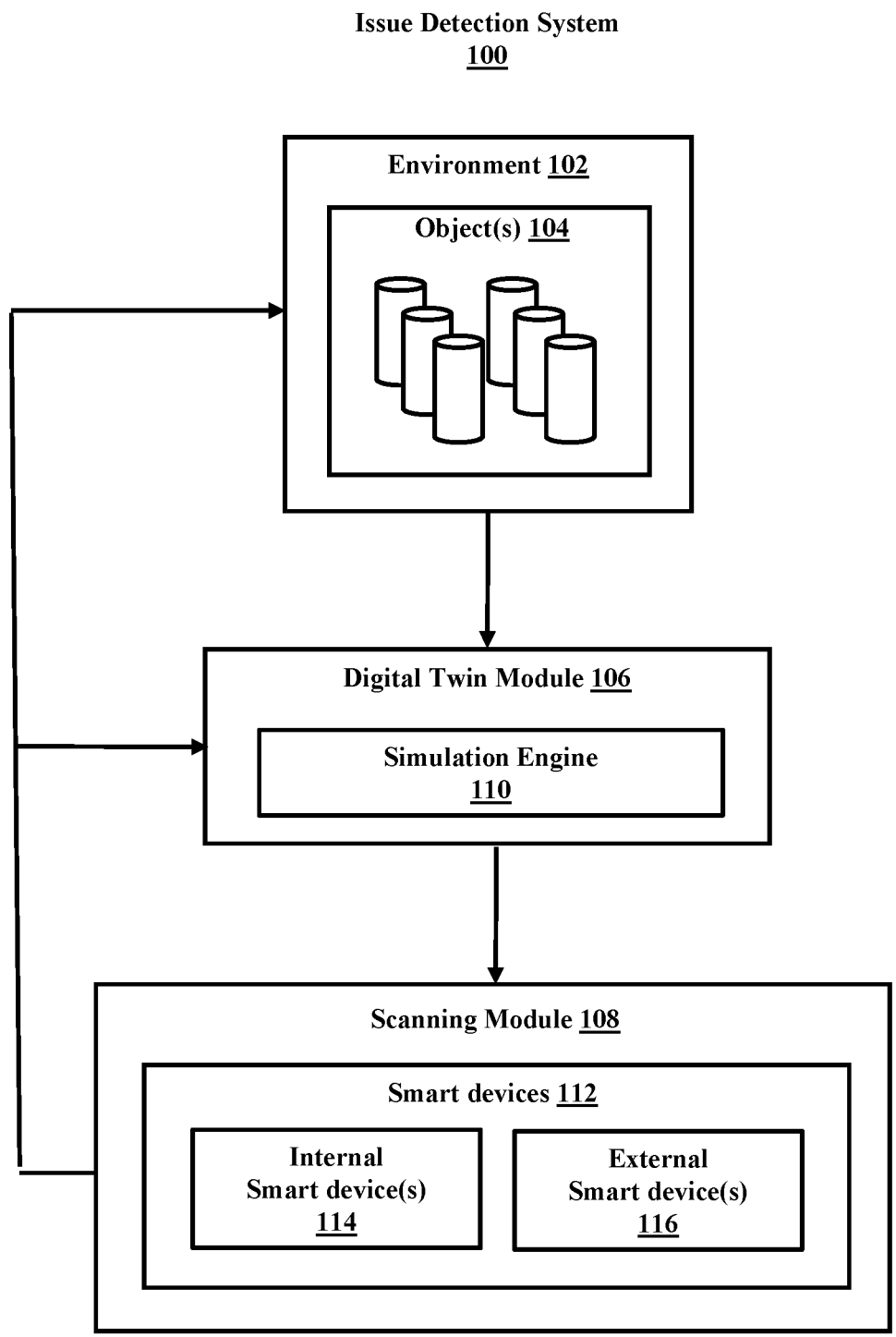
FIG. 1 depicts a block diagram of an embodiment of an issue detection system, in accordance with the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the disclosure.

DETAILED DESCRIPTION

Aspects of the present disclosure relate generally to the field of artificial intelligence (AI), and more particularly to smart devices. While the present disclosure is not necessarily limited to such applications, various aspects of the disclosure may be appreciated through a discussion of several examples using this context.

To visually inspect a machine, video and images of the machine are usually needed while the machine is performing the function or activity as intended to identify any potential issues the machine may have. Often it is difficult to capture video and images from various directions for the duration of the activity. This would require an inefficient amount of storage and processing power. To effectively address this issue, the video and imaging capturing would need to be performed approximately the time the issue with the machine occurs. As such, there is a desire for a solution that may enable video and imaging capturing devices to be correctly positioned in the vicinity of the machine when the issue is likely to occur.

Before turning to the FIGS. it is noted that the benefits/novelties and intricacies of the proposed solution are that:

The issue detection system may be configured to perform digital twin simulations of the object while the objects are performing one or more activities. The issue detection system may be configured to identify a particular activity being performed by the object. The issue detection system may be configured to identify one or more issues associated with the object. In embodiments where the issue detection system identifies one or more issues, the issue detection system may be configured to deploy (e.g., automatically deploy) one or more smart devices (e.g., cameras, scanning modules, etc.) in the environment where the object is located. In some embodiments, the issue detection system may be configured to deploy the one or more smart devices to the particular component associated with the object where the issue detection system has identified one or more issues. The issue detection system may use the one or more devices to capture data (e.g., issue data associated with pre and post issue identification). This data (e.g., issue data) may be used to analyze, remedy, and/or generate a plan that will minimize the negative effects of the one or more issues.

The issue detection system may use the digital twin simulation to consider (e.g., in real-time) data (e.g., object data). Object data may include, but is not limited to object's health, object's physical structure, and the object's condition. Such object data may impact an object's ability to perform a particular activity.

The issue detection system may use the digital twin simulation of the object and activity to identify the types of one or more issues that may be associated with the machine, when the one or more issues may occur, activity performed by the object where one or more issues may occur or be exacerbated, and what particular components of the object may be impacted by the one or more issues. In these embodiments, the issue detection system may be configured to analyze (e.g., using AI and machine learning techniques) historical data (e.g., object data and/or issue data) to determine and identify the possible impact of the one or more issues (e.g., present determined statistics of the one or more issues possible to a user).

The issue detection system may be configured to proactively install smart devices in the surround environment and/or in the object to capture the one or more issues associated with the object. The issue detection system may base the deployed smart devices based on the attributes necessary to properly document and collect issues data regarding the one or more issues associated with a particular component of the object.

The issue detection system may be configured to use the digital twin simulation to identify if any internal component of the object (e.g., particular component) may have one or more issues. In some embodiments, the feed from the one or more smart devices may not be sufficient to analyze the one or more issues of an internal component. In such embodiments, the issue detection system may be configured enable one or more smart devices (e.g., sensors) configured as part of the object to collect object data. These embodiments may result in increasing the data generation frequency that may be used to identify one or more issues.

The issue detection system may be configured to have an AI module (e.g., simulation module/digital twin engine). In embodiments, the proposed AI module may be configured to identify what types of smart devices may be required to detect the one or more issues (e.g., collect issue data). In embodiments, the smart devices (e.g., scanning modules, thermal imaging, infrared imaging, etc.) to analyze/identify the one or more issues.

The issue detection system may have multiple objects associated with one or more activities in a particular environment. In embodiments, the simulation module/digital twin engine may be configured to simulation how the one or more issues associated with an object may propagate and impact other objects performing actives in the environment. In these embodiments, one or more smart devices may be deployed by the issue detection system to capture/collect object data and/or issue data. By capturing/collecting object data and/or issues data, the issue detection system may be configured to more complexly investigate the one or more issues associated with the device.

The issue detection system may have multiple objects associated with one or more activities in a particular environment. The issue detection system may be configured to use one or more generated digital twin models to control the Field of View of the one or more smart devices (e.g., degree of zoom). Such embodiments ensure that the one or more smart devices may be configured in such a manner as to ensure maximum coverage may be performed to capture the visual information (e.g., object data and/or issue data) from the environment.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

It will be readily understood that the instant components, as generally described and illustrated in the figures herein, may be arranged and designed in a wide variety of different configurations. Accordingly, the following detailed description of the embodiments of at least one of a method, apparatus, non-transitory computer readable medium and system, as represented in the attached figures, is not intended to limit the scope of the application as claimed but is merely representative of selected embodiments.

The instant features, structures, or characteristics as described throughout this specification may be combined or removed in any suitable manner in one or more embodiments. For example, the usage of the phrases "example embodiments," "some embodiments," or other similar language, throughout this specification refers to the fact that a particular feature, structure, or characteristic described in connection with the embodiment may be included in at least one embodiment. Accordingly, appearances of the phrases "example embodiments," "in some embodiments," "in other embodiments," or other similar language, throughout this specification do not necessarily all refer to the same group of embodiments, and the described features, structures, or characteristics may be combined or removed in any suitable manner in one or more embodiments. Further, in the FIGS., any connection between elements can permit one-way and/or two-way communication even if the depicted connection is a one-way or two-way arrow.

Also, any device depicted in the drawings can be a different device. For example, if a mobile device is shown sending information, a wired device could also be used to send the information. The term "module" may refer to a hardware module, software module, or a module may be a combination of hardware and software resources. Embodiments of hardware-based modules may include self-contained components such as chipsets, specialized circuitry, one or more memory devices and/or persistent storage. A software-based module may be part of a program, program code or linked to program code containing specifically programmed instructions loaded into a memory device or persistent storage device of one or more data processing systems operating as part of the computing environment (e.g., issue detection system 100).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application and to enable others of ordinary skill in the art to understand the disclosure for various embodiments with various modifications as are suited to the particular use contemplated.

In embodiments discussed herein, solutions are provided in the form of a method, system, and computer program product, for issue detection. Embodiments contemplated herein may ensure that devices, such as machinery and equipment, are able to perform their various functions without issue.

In embodiments, issue detection system 100 may be configured to collect information and/or feedback associated with how one or more components of an object may be impacted over time (e.g., how one or more issues may arise within the object) and/or how the one or more components of an object may be impacted (e.g., how will use affect the wear and tear of the object) when performing one or more activities.

In embodiments, issue detection system 100 may be configured to identify one or more issue associated with the object and the object performing activities.

In embodiments, issue detection system 100 may be configured to generate one or more digital twin simulations of the object, in a particular environment, and performing one or more activities.

In embodiments, issue detection system 100 may collect object data that includes information/data associated with the environment. This information may include weather conditions and environmental parameters (e.g., wet soil can create impact to the activity or in the object like rust).

In embodiments, issue detection system 100 may be configured to identify when an object may have one or more issues while performing the one or more activities. In some embodiments, this may be based on digital twin simulation.

In embodiments, issue detection system 100 may be configured to use AI and machine learning techniques to generate a knowledge corpus. In some embodiments, the knowledge corpus may be generated using various information such as object data and/or issue data.

In embodiments, issue detection system 100 may be configured to identify what types of issue data (e.g., visual data associated with a particular component having one or more issues) may be needed to perform one or more analyses. In some embodiments, this may be based on the one or more digital twins generated.

In embodiments, issue detection system 100 may be configured to identify where the one or more issues may arise in an object (e.g., at a particular component).

In embodiments, issue detection system 100 may be configured to identify a threshold level of failure parameters. In embodiments, the level of failure parameters and whether the threshold has been exceeded a threshold level may be identified using one or more digital twin simulations.

In embodiments, issue detection system 100 may be configured to identify whether one or more issues associated with a particular component may be viewed while a smart device is externally positioned to the object. In embodiments where the one or more issues may be visualized from the outside, the issue detection system 100 may be configured to capture the one or more issues with a smart device (e.g., camera system).

In embodiments, issue detection system 100 may be configured to deploy a sufficient number of smart devices (e.g., camera systems, scanning modules, etc.). In some embodiments these smart devices may be positioned in a position that may allow the smart device to collect issue data associated with the one or more issues.

The issue detection system may be deploying appropriate number of cameras, scanning modules in the appropriate place around the object.

The camera or scanning module will be initiating image and video capturing so that entire pre to post problematic scenario can be captured.

If the one or more issues are not visible from outside, then the issue detection system may be configured to enabling appropriate sensors (e.g., smart devices) with the object and will be changing the data generation frequency.

In embodiments, the issue detection system may be configured to analyze the captured video and images (e.g., issues data). In these embodiments, the issue detection system may be configured to perform analyses of how the one or more issues may happen. The issue detection system may dynamically be changing the smart devices (e.g., camera field of View, zoom level, color filters, etc.), based on the digital twin simulation results. The issue detection system may identify what types of issues are happening with the existing objects so that redesigning can be planned for future object manufacturing.

Turning now to the figures, FIG. 1 depicts issue detection system 100, in accordance with embodiments of the present disclosure. FIG. 1 provides an illustration of only one embodiment and does not imply any limitations with regard to the environments in which different embodiments may be implemented. Many modifications to the depicted environment may be made by those skilled in the art without departing from the scope of the invention as recited by the claims.

In embodiments, issue detection system 100 may perform issue detection and associated with one or more objects 104 in environment 102. Issue detection system 100 may include, but is not limited to environment 102, digital twin module 106, and scanning module 108. While embodiments contemplated herein may often refer to object 104 as a type of machinery, object 104 may include any physical object. For example, object 102 may include, but is not limited to, bridges, buildings, machinery (e.g., cranes, bulldozers, excavators, etc.), or any other structure or product, such as those that are not easily inspected by a user. Environment 102 may include any area or boundary surrounding the one or more objects. In some embodiments, environment 102 may include other items that are not object 104. In these embodiments, the other items in environment 102 may be similar to object 104, but are analyzed as part of the issue detection processes performed by issue detection system 100.

In embodiments, issue detection system 100 may be configured to receive to receive object data associated with an object in an environment. In some embodiments, issue detection system 100 may be configured to collect object data using one or more data collection devices or one or more smart devices 112. Object data may include, but is not limited to, information/data associated with: i) the configuration of environment 102 (e.g., the size of the space available, potential items within environment 102, etc.); ii) the number and different types of one or more smart devices 112 (e.g., internal smart device(s) 114 and/or external smart device(s) 116); iii) information associated with one or more potential issues; iv) data associated with object health (e.g., object's ability to perform a particular activity and object structure); v) information associated that may be needed to perform digital twin simulation (e.g., via digital twin modules 106) of the real/actual situation of object 104 in environment 102; the location of object 104 and its proximity to other items in environment 102 (e.g., issue data); vi) real-time information associated with the one or more objects 104, environment 102, and/or one or more issues (e.g., data associated with an object performing an activity, how performance of the activity impacts the issue, etc.); vii) information/data generated from various analyses contemplated herein (e.g., information/data generated by AI and machine learning analysis via digital twin module 106); viii) predicted risk or predicted issues that may be associated with object 104; and ix), databases having information/data associated with the same or similar objects 104 in same or similar issues and/or environments 102; x) information associated with how various environmental parameters may impact object 104 and the identified issues (e.g., factors that may increase or decrease the likelihood of an issue activating a threshold level).

In embodiments, issue detection system 100 may be configured to store object data collected over time in a historical repository. The historical repository may include any object data contemplated herein. In embodiments, issue detection system 100 may access the historical repository to generate one or more simulations using AI and machine learning capabilities (e.g., digital twin module 106). The information generated from these analyses may be considered object data and may also be stored within the historical repository.

In embodiments, issue detection system 100 may be configured to determine if the issue can be visualized from the outside of the object or not. In these embodiments, issue detection system 100 may configure scanning module 108. Scanning module 108 may include one or more smart devices 112. One or more smart devices 112 may include, but are not limited to, Internet of Things (IoT) devices, cameras, infrared sensors, ultrasounds, chemical sensors, smart devices, or any combination thereof. In some embodiments, the one or more smart devices 112 may be configured to move within environment 102 and/or object 104 to collect/receive object data (e.g., data associated with object 104).

In embodiments, issue detection system 100 may be configured to use digital twin module 106 to generate one or more simulations (e.g., digital twin simulations) using object data. Digital twin module 106 may be enabled using AI and machine learning techniques and may generate the one or more simulations/digital twins (e.g., via simulation engine 110) to perform the various analyses contemplated herein. Issue detection system 100 may generate one or more simulations/digital twins associated with object 104 and/or environment 102. In some embodiments, issue detection system 100 may be configured to use historical object data/issue data (e.g., stored in a historical repository) to generate a knowledge corpus from the simulations contemplated herein and other issues identified (e.g., issues identified by a user).

The one or more digital twin simulations may be associated with object 104 (e.g., machine) and the environment 102 associated with object 104. In embodiments, the digital twin simulations may include how various aspects of the object's environment may impact the object (e.g., weather conditions, unstable soil, unstable structures positioned nearby object 104, etc.). While in some embodiments, object 104 may be configured to be stationary (e.g., bridge, building, etc.), in other embodiments, object 104 may be configured to perform functions or activities. In some embodiments, when object 104 is performing the function or activity, the activity may affect or increase the likelihood of an issue occurring (e.g., increase the object issue level may exceed/activate the issue threshold level). While in some embodiments, issue detection system 100 may be configured to perform the digital twin simulations prior to object 104 performing an activity, in other embodiments, issue detection system 100 may configure digital twin module to perform digital twin simulation while the object is performing the activity. This may be used to predict when the object may an issue during performance In embodiments, issue detection system 100 may be configured to analyze the one or more simulations/digital twins to identify one or more potential issues associated with the object. A potential issue may include any issue or potential hazard or damage that may occur to object 104, either internally or externally. In one example embodiment, where object 102 is a crane used to construct a building, issue detection system 100 may identify issues such as, potential electrical issues, hydraulic issues, external structural damages (e.g., cracks in a crane support component), computer processing issues, or any combination thereof.

In embodiments, once issue detection system 100 has identified one or more potential issues, issue detection system 100 may configure scanning module 108 to deploy one or more smart devices 112 to the object. Issue detection system 100 may configure the one or more smart devices 112 to capture issue data associated the one or more potential issues. In embodiments, issue data may include, but is not limited to where a particular issue is located, how significant the issue is, and information associated with environment 102 that may impact the issue (e.g., sever windstorm that may stress various structures of object 104). Issue data may be considered a type of object data. In embodiments, issue detection system 100 may configure the smart devices 112 to dynamically change the camera field of view, zoom level, and/or color filters, to maximize the amount of issue data/object data that may be captured.

In these embodiments, issue detection system 100 may be configured to ensure the one or more smart device 112 (e.g., internal smart devices and/or external smart devices 116) provides sufficient converge of the one or more potential issues (e.g., to collect object data/issue data). Issue detection system 100 may configure the one or more smart devices 112 to initiate image and video capturing to ensure there is documentation and issue data collection for the one or more potential issues. In embodiments, issue detection system 100 may be configured to determine the number of smart devices 112, the type of smart devices 112 (e.g., each smart device may have different abilities to collect different data), and location of each smart device 112. In some embodiments, issue detection system 100 may be configured to receive/collect issue data/object data prior to the issue arising, during the occurrence of the issue, after the issue has been detected (e.g., no longer a potential issue, it is an actual issue), and/or after the issue has been resolved.

In embodiments, issue detection system 100 may be configured to analyze the one or more potential issues (e.g., issue data) and object 104 (e.g., building) to determine whether the one or more potential issues are associated with an external component of the object. External components of object 104 may be those object components that are exposed to environment 102. In these embodiments, issue detection system 100 may be configured to deploy one or more external smart devices of the one or more smart devices to the external component of the object. External components may be easily accessible by one or more external smart devices 116. In embodiments, issue detection system 100 may configure the one or more external smart devices 116 to move to the location of the external component of object 104. In these embodiments, external smart devices 116 may be configured to be mobile (e.g., fly, crawl, climb, etc.).

In embodiments, issue detection system 100 may be configured to analyze the one or more potential issues (e.g., issue data) and object 104 (e.g., building) to determine whether the one or more potential issues are associated with an internal component of the object. Internal components of object 104 may be those object components (e.g., parts of object 104) that are not exposed to environment 102. In these embodiments, issue detection system 100 may be configured to activate one or more internal smart devices 114 of the one or more smart devices 112 to the internal component of the object. Because internal components of object 104 may not be accessible or viewable (e.g., when using one or more external smart devices 116), internal smart devices 114 may be configured within object 104. While in some embodiments, one or more internal smart devices 114 may be proactively installed within object 104 to detect the one or more potential issues, in other embodiments, the one or more internal smart devices 114 may components of object 104 (e.g., one or more sensors that are were installed as part of the manufacturing process). In some embodiments, issue data/object data may be collected at a greater frequency by internal smart devices 114 than if the potential issue is detected on the external surface of the object. In these embodiments, issue detection system 100 may auto-enable the appropriate sensors (e.g., reconfigure those sensors so that the sensors can increase the data generation frequency) this allows for additional data to be generated for a more complete issue detection process.

In embodiments, issue detection system 100 may be configured to analyze issue data and a particular potential issue of the one or more potential issues of the object. In these embodiments, issue detection system 100 may be configured to identify an object issue level for the particular potential issue. An object issue level may refer to how likely a potential issue is likely to occur. In these embodiments, a potential issue with a higher object issue level may indicate that a potential issue is more likely to occur while a potential issue with a lower object issue level may indicate that the potential issue is less likely to occur.

In embodiments, once an object issue level associated with a particular potential issue has been determined, issue detection system 100 may be configured to determine whether the object issue level of the particular potential issue exceeds an issue threshold level. In embodiments, issue detection system 100 may be configured to determine the object issue level of the particular potential issue exceeds the issue threshold level. In these embodiments, issue detection system 100 may then deploy one or more additional smart device 112 (e.g., internal smart device 114 and/or external smart device 116) to the particular potential issue of the object for an issue duration. The issue duration may include from the time prior to the issue actually occurring to after the issue has occurred. This data (e.g., object data/issue data) may be used to determine the cause (e.g., repeated stress to structure, age of object component, etc.) of the particular potential issue.

In embodiments, issue detection system 100 may be configured to determine the object issue level does not exceed the issue threshold level. In embodiments where the object issue level is determined not to exceed the issue threshold level, issue detection system 100 may be configured to monitor the one or more potential issues using the one or more smart devices 112 and for one or more new potential issues. In embodiments, issue detection system 100 may be configured to analyze the issue data associated with the object over a duration of time (e.g., any set time duration). In these embodiments, issue detection system 100 may be configured to generate one or more recommendations using digital twin module 106. These one or more recommendations may be associated with a redesign of the object. For example, the one or more recommendations may include workarounds that would prevent or reduce the likelihood of a potential issue associated with object 104 from occurring.

In embodiments, issue detection system 100 may also be configured to analyze object data associated with environment 102. In these embodiments, issue detection system 100 may determine how environment 102 may be impacted if the one or more potential issues were to occur (e.g., will other structures be damaged if the object falls in a particular direction). Issue detection system 100 may be configured to determine not only the level of impact of the one or more potential issues but also the range of the impact and issue statistics generated by the system regarding the likelihood of each of the one or more potential issues. Additional smart devices may be deployed (e.g., automatically deployed) to capture object data/issue data.

Figure 2:
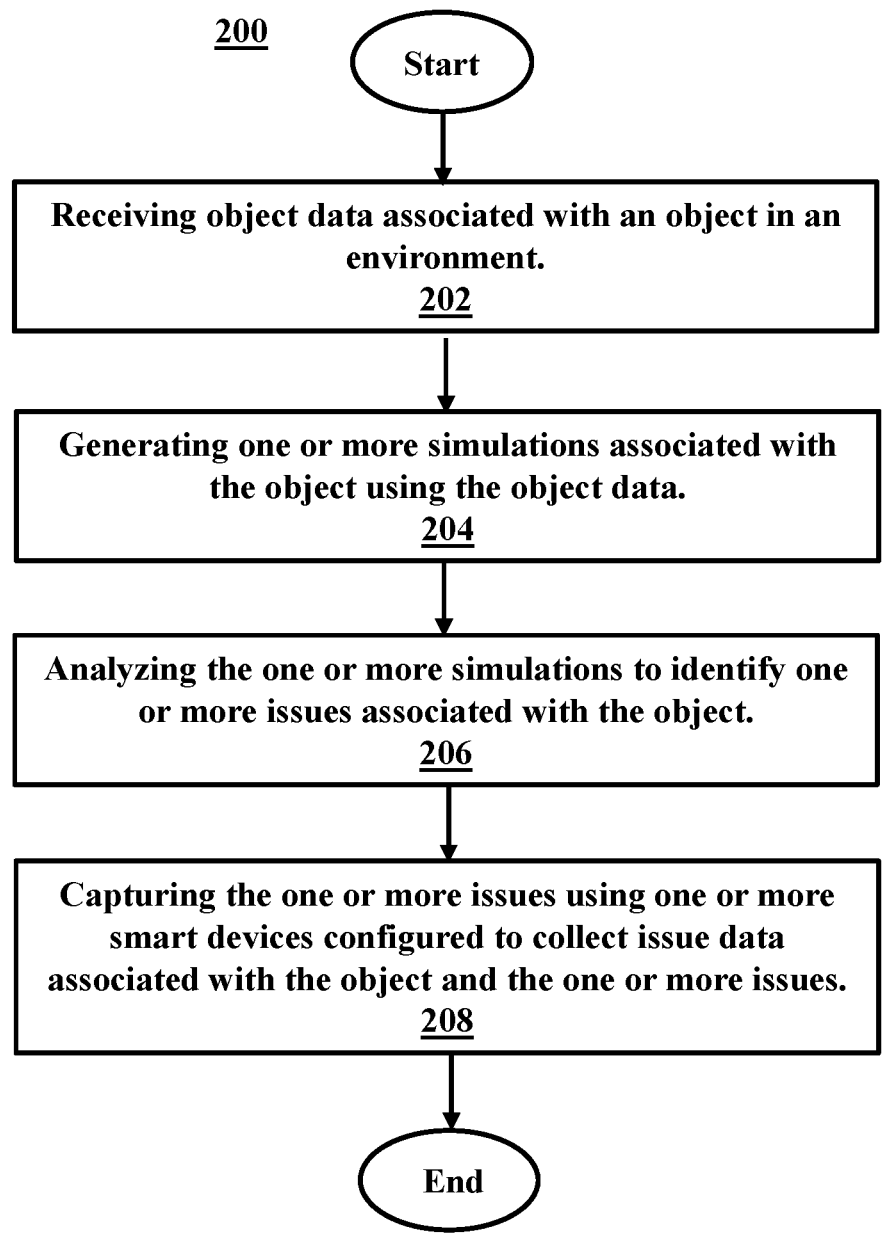
FIG. 2 illustrates a flowchart of a method for issue detection, in accordance with embodiments of the present disclosure.

Referring now to FIG. 2, a flowchart illustrating an example method 200 for issue detection, in accordance with embodiments of the present disclosure. FIG. 2 provides an illustration of only one implementation and does not imply any limitations with regard to the environments in which different embodiments may be implemented. Many modifications to the depicted environment may be made by those skilled in the art without departing from the scope of the invention as recited by the claims.

In some embodiments, the method 200 begins at operation 202. At operation 202 a processor may receive object data associated with an object in an environment. The method 200 may proceed to operation 204.

At operation 204, a processor may generate one or more simulations associated with the object using the object data. The method 200 proceeds to operation 206.

At operation 206, a processor may analyze the one or more simulations to identify one or more potential issues associated with the object. The method 200 proceeds to operation 208.

At operation 208, a processor may deploy the one or more smart devices to the object to capture issue data associated the one or more potential issues. The method 200 proceeds to operation 210. In some embodiments, as depicted in FIG. 2, after operation 210, the method 200 may end.

In some embodiments, discussed below there are one or more operations of the method 200 not depicted for the sake of brevity and which are discussed throughout this disclosure. Accordingly, in some embodiments, the processor may analyze the one or more potential issues and the object to determine whether the one or more potential issues are associated with an external component of the object. The processor may then deploy one or more external smart devices of the one or more smart devices to the external component of the object.

In some embodiments, the processor may analyze the one or more potential issues and the object to determine whether the one or more potential issues are associated with an internal component of the object. In these embodiments, the processor may then activate one or more internal smart devices of the one or more smart devices associated with the internal component of the object.

In some embodiments, the processor may analyze issue data and a particular potential issue of the one or more potential issues of the object. The processor may then identify an object issue level for the particular potential issue. In these embodiments, the processor may determine whether the object issue level associated with the particular potential issue activates an issue threshold level. In embodiments where the processor determines the object issue level exceeds the issue threshold level, the processor may deploy an additional smart device to the particular potential issue of the object for an issue duration. The processor may use this information associated with the additional smart device to determine a cause of the particular potential issue. In embodiments where the processor determines the object issue level does not exceed the issue threshold level, the processor may monitor the one or more potential issues using the one or more smart devices.

In some embodiments, the processor may analyze the issue data associated with the object over a duration of time. In these embodiments, the processor may generate one or more recommendations. These one or more recommendations may be associated with a redesign of the object.

It is noted that various aspects of the present disclosure are described by narrative text, flowcharts, block diagrams of computer systems and/or block diagrams of the machine logic included in computer program product (CPP) embodiments. With respect to any flowcharts (depending upon the technology involved) the operations can be performed in a different order than what is shown in the flowchart. For example, two operations shown in successive flowchart blocks may be performed in reverse order, as a single integrated step, concurrently, or in a manner at least partially overlapping in time. A computer program product embodiment ("CPP embodiment") is a term used in the present disclosure that may describe any set of one or more storage media (or "mediums") collectively included in a set of one or more storage devices. The storage media may collectively include machine readable code corresponding to instructions and/or data for performing computer operations. A "storage device" may refer to any tangible hardware or device that can retain and store instructions for use by a computer processor. Without limitation, the computer readable storage medium may include an electronic storage medium, a magnetic storage medium, an optical storage medium, an electromagnetic storage medium, a semiconductor storage medium, a mechanical storage medium, and/or any combination thereof. Some known types of storage devices that include mediums referenced herein may include a diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination thereof. A computer-readable storage medium should not be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As understood by those skilled in the art, data is typically moved at some occasional points in time during normal operations of a storage device, such as during access, de-fragmentation or garbage collection, but this does not render the storage device as transitory because the data is not transitory while it is stored.

Figure 3:
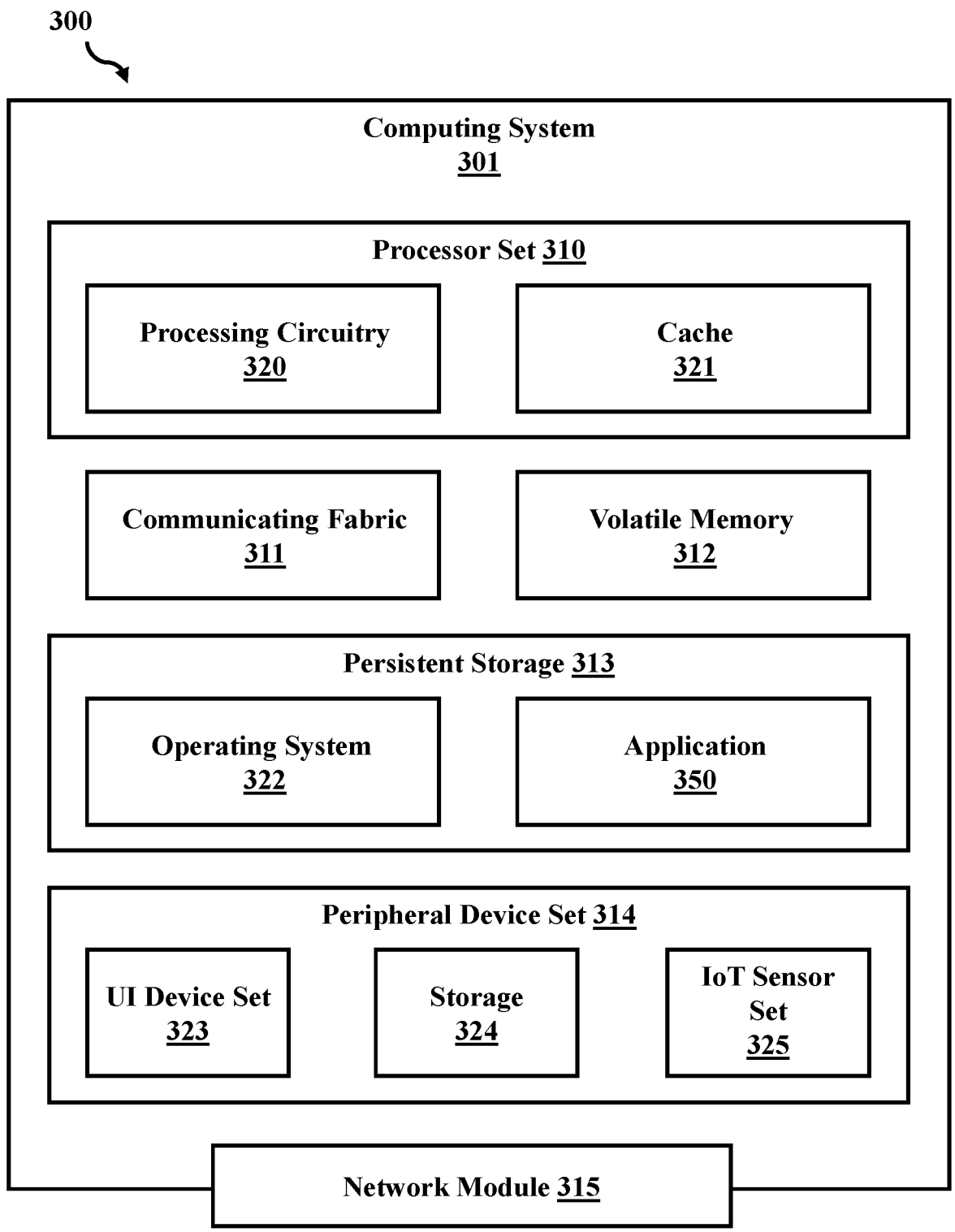
FIG. 3 depicts a block diagram illustrating an embodiment of a computer system and the components thereof, upon which embodiments described herein may be implemented in accordance with the present disclosure.

Referring now to FIG. 3, illustrated is a block diagram describing an embodiment of a computing system 301 within in a computing environment, which may be a simplified example of a computing device (i.e., a physical bare metal system and/or a virtual system) capable of performing the computing operations described herein. Computing system 301 may be representative of the one or more computing systems or devices implemented in accordance with the embodiments of the present disclosure and further described below in detail. It should be appreciated that FIG. 3 provides only an illustration of one implementation of a computing system 301 and does not imply any limitations regarding the environments in which different embodiments may be implemented. In general, the components illustrated in FIG. 3 may be representative of an electronic device, either physical or virtualized, capable of executing machine-readable program instructions.

Embodiments of computing system 301 may take the form of a desktop computer, laptop computer, tablet computer, smart phone, smart watch or other wearable computer, mainframe computer, server, quantum computer, a non-conventional computer system such as an autonomous vehicle or home appliance, or any other form of computer or mobile device now known or to be developed in the future that is capable of running a program 350, accessing a network 302 or querying a database, such as remote database 330. Performance of a computer-implemented method executed by a computing system 301 may be distributed among multiple computers and/or between multiple locations. Computing system 301 may be located as part of a cloud network, even though it is not shown within a cloud in FIGS. 3-2. Moreover, computing system 301 is not required to be in a cloud network except to any extent as may be affirmatively indicated.

Processor set 310 includes one, or more, computer processors of any type now known or to be developed in the future. Processing circuitry 320 may be distributed over multiple packages. For example, multiple, coordinated integrated circuit chips. Processing circuitry 320 may implement multiple processor threads and/or multiple processor cores. Cache 321 may refer to memory that is located on the processor chip package(s) and/or may be used for data or code that can be made available for rapid access by the threads or cores running on processor set 310. Cache 321 memories can be organized into multiple levels depending upon relative proximity to the processing circuitry 320. Alternatively, some, or all of cache 321 of processor set 310 may be located "off chip." In some computing environments, processor set 310 may be designed for working with qubits and performing quantum computing.

Computer readable program instructions can be loaded onto computing system 301 to cause a series of operational steps to be performed by processor set 310 of computing system 301 and thereby implement a computer-implemented method. Execution of the instructions can instantiate the methods specified in flowcharts and/or narrative descriptions of computer-implemented methods included in this specification (collectively referred to as "the inventive methods"). The computer readable program instructions can be stored in various types of computer readable storage media, such as cache 321 and the other storage media discussed herein. The program instructions, and associated data, can be accessed by processor set 310 to control and direct performance of the inventive methods. In computing environments of FIGS. 3-2, at least some of the instructions for performing the inventive methods may be stored in persistent storage 313, volatile memory 312, and/or cache 321, as application(s) 350 comprising one or more running processes, services, programs and installed components thereof. For example, program instructions, processes, services and installed components thereof may include the components and/or sub-components of the system 100 as shown in FIG. 1.

Communication fabric 311 may refer to signal conduction paths that may allow the various components of computing system 301 to communicate with each other. For example, communications fabric 311 can provide for electronic communication among the processor set 310, volatile memory 312, persistent storage 313, peripheral device set 314 and/or network module 315. Communication fabric 311 can be made of switches and/or electrically conductive paths, such as the switches and electrically conductive paths that make up busses, bridges, physical input/output ports and the like. Other types of signal communication paths may be used, such as fiber optic communication paths and/or wireless communication paths.

Volatile memory 312 may refer to any type of volatile memory now known or to be developed in the future, and may be characterized by random access, but this is not required unless affirmatively indicated. Examples include dynamic type random access memory (RAM) or static type RAM. In computing system 301, the volatile memory 312 is located in a single package and can be internal to computing system 301, but, alternatively or additionally, the volatile memory 312 may be distributed over multiple packages and/or located externally with respect to computing system 301. Application 350, along with any program(s), processes, services, and installed components thereof, described herein, may be stored in volatile memory 312 and/or persistent storage 313 for execution and/or access by one or more of the respective processor sets 310 of the computing system 301.

Persistent storage 313 can be any form of non-volatile storage for computers that may be currently known or developed in the future. The non-volatility of this storage means that the stored data may be maintained regardless of whether power is being supplied to computing system 301 and/or directly to persistent storage 313. Persistent storage 313 may be a read only memory (ROM), however, at least a portion of the persistent storage 313 may allow writing of data, deletion of data and/or re-writing of data. Some forms of persistent storage 313 may include magnetic disks, solid-state storage devices, hard drives, flash-based memory, erasable read-only memories (EPROM) and semi-conductor storage devices. Operating system 322 may take several forms, such as various known proprietary operating systems or open-source Portable Operating System Interface type operating systems that employ a kernel.

Peripheral device set 314 includes one or more peripheral devices connected to computing system 301. For example, via an input/output (I/O interface). Data communication connections between the peripheral devices and the other components of computing system 301 may be implemented using various methods. For example, through connections using Bluetooth, Near-Field Communication (NFC), wired connections or cables (such as universal serial bus (USB) type cables), insertion type connections (for example, secure digital (SD) card), connections made though local area communication networks and/or wide area networks such as the internet. In various embodiments, UI device set 323 may include components such as a display screen, speaker, microphone, wearable devices (such as goggles, headsets and smart watches), keyboard, mouse, printer, touchpad, game controllers, and haptic feedback devices. Storage 324 can include external storage, such as an external hard drive, or insertable storage, such as an SD card. Storage 324 may be persistent and/or volatile. In some embodiments, storage 324 may take the form of a quantum computing storage device for storing data in the form of qubits. In some embodiments, networks of computing systems 301 may utilize clustered computing and components acting as a single pool of seamless resources when accessed through a network by one or more computing systems 301. For example, a storage area network (SAN) that is shared by multiple, geographically distributed computer systems 301 or network-attached storage (NAS) applications. IoT sensor set 325 can be made up of sensors that can be used in Internet-of-Things applications. For example, a sensor may be a temperature sensor, motion sensor, infrared sensor or any other type of known sensor type.

Network module 315 may include a collection of computer software, hardware, and/or firmware that allows computing system 301 to communicate with other computer systems through a network 302, such as a LAN or WAN. Network module 315 may include hardware, such as modems or Wi-Fi signal transceivers, software for packetizing and/or de-packetizing data for communication network transmission, and/or web browser software for communicating data over the network. In some embodiments, network control functions and network forwarding functions of network module 315 are performed on the same physical hardware device. In other embodiments (for example, embodiments that utilize software-defined networking (SDN)), the control functions and the forwarding functions of network module 315 can be performed on physically separate devices, such that the control functions manage several different network hardware devices. Computer readable program instructions for performing the inventive methods can typically be downloaded to computing system 301 from an external computer or external storage device through a network adapter card or network interface included in network module 315.

Figure 4:
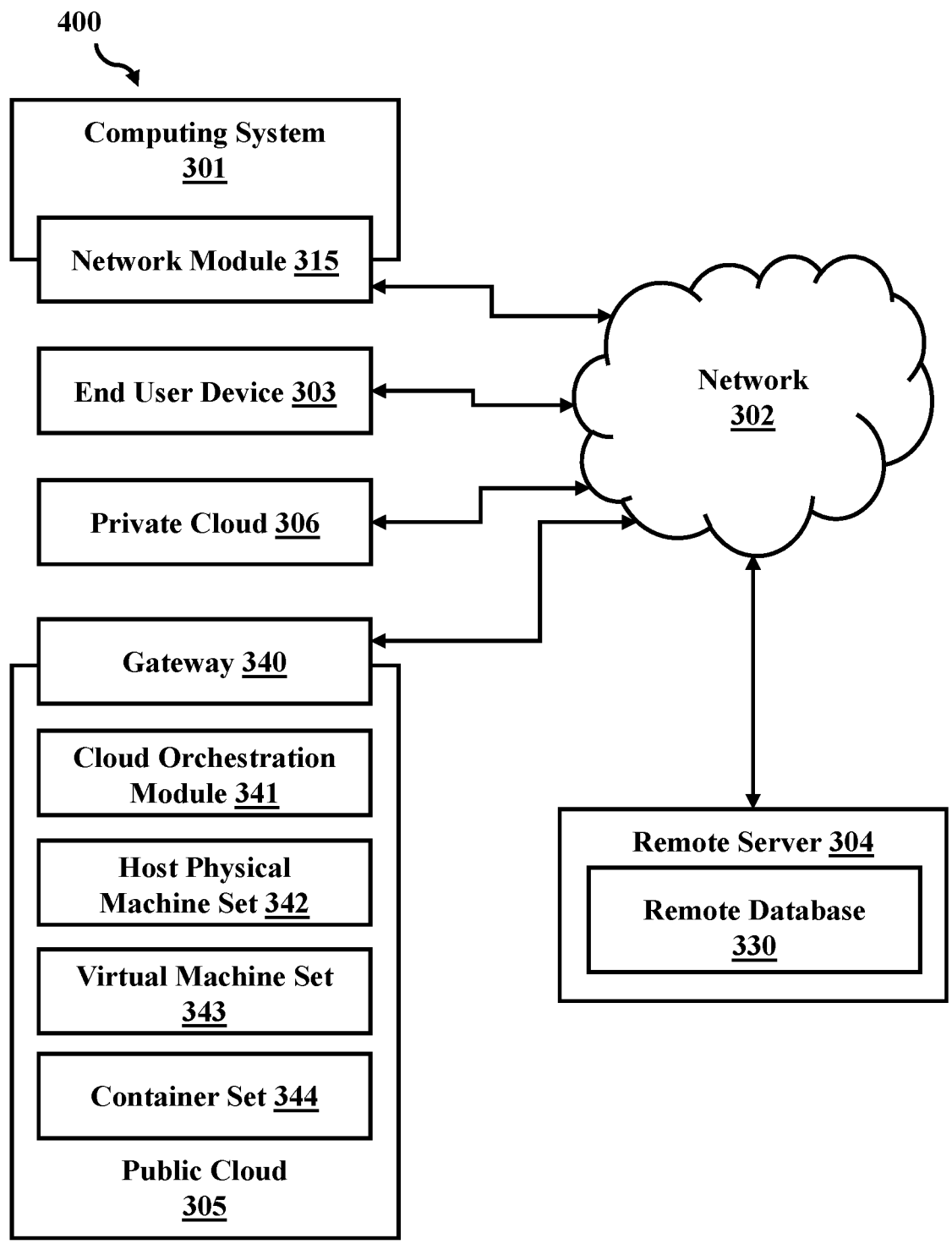
FIG. 4 depicts a block diagram illustrating an extension of the computing system environment of FIG. 3, wherein the computer systems are configured to operate in a network environment (including a cloud environment), and perform methods described herein in accordance with the present disclosure.

Continuing, FIG. 4 depicts a computing environment 400 which may be an extension of the computing environment 300 of FIG. 3, operating as part of a network. In addition to computing system 301, computing environment 400 can include a network 302 such as a wide area network (WAN) (or another type of computer network) connecting computing system 301 to an end user device (EUD) 303, remote server 304, public cloud 305, and/or private cloud 306. In this embodiment, computing system 301 includes processor set 310 (including processing circuitry 340 and cache 321), communication fabric 311, volatile memory 312, persistent storage 313 (including operating system 322 and program(s) 350, as identified above), peripheral device set 314 (including user interface (UI), device set 323, storage 324, Internet of Things (IOT) sensor set 325), and network module 315. Remote server 304 includes remote database 330. Public cloud 305 includes gateway 340, cloud orchestration module 341, host physical machine set 342, virtual machine set 343, and/or container set 344.

Network 302 may be comprised of wired or wireless connections. For example, connections may be comprised of computer hardware such as copper transmission cables, optical transmission fibers, wireless transmission, routers, firewalls, switches, gateway computers and/or edge servers. Network 302 may be described as any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. Other types of networks that can be used to interconnect the various computer systems 301, end user devices 303, remote servers 304, private cloud 306 and/or public cloud 305 may include Wireless Local Area Networks (WLANs), home area network (HAN), backbone networks (BBN), peer to peer networks (P2P), campus networks, enterprise networks, the Internet, single tenant or multi-tenant cloud computing networks, the Public Switched Telephone Network (PSTN), and any other network or network topology known by a person skilled in the art to interconnect computing systems 301.

End user device 303 can include any computer device that can be used and/or controlled by an end user (for example, a customer of an enterprise that operates computing system 301) and may take any of the forms discussed above in connection with computing system 301. EUD 303 may receive helpful and useful data from the operations of computing system 301. For example, in a hypothetical case where computing system 301 is designed to provide a recommendation to an end user, this recommendation may be communicated from network module 315 of computing system 301 through WAN 302 to EUD 303. In this example, EUD 303 can display, or otherwise present, the recommendation to an end user. In some embodiments, EUD 303 may be a client device, such as thin client, thick client, mobile computing device such as a smart phone, mainframe computer, desktop computer and so on.

Remote server 304 may be any computing systems that serves at least some data and/or functionality to computing system 301. Remote server 304 may be controlled and used by the same entity that operates computing system 301. Remote server 304 represents the machine(s) that collect and store helpful and useful data for use by other computers, such as computing system 301. For example, in a hypothetical case where computing system 301 is designed and programmed to provide a recommendation based on historical data, the historical data may be provided to computing system 301 from remote database 330 of remote server 304.

Public cloud 305 may be any computing systems available for use by multiple entities that provide on-demand availability of computer system resources and/or other computer capabilities including data storage (cloud storage) and computing power, without direct active management by the user. The direct and active management of the computing resources of public cloud 305 can be performed by the computer hardware and/or software of cloud orchestration module 341. The computing resources provided by public cloud 305 can be implemented by virtual computing environments that run on various computers making up the computers of host physical machine set 342, and/or the universe of physical computers in and/or available to public cloud 305. The virtual computing environments (VCEs) may take the form of virtual machines from virtual machine set 343 and/or containers from container set 344. It is understood that these VCEs may be stored as images and may be transferred among and between the various physical machine hosts, either as images or after instantiation of the VCE. Cloud orchestration module 341 manages the transfer and storage of images, deploys new instantiations of VCEs and manages active instantiations of VCE deployments. Gateway 340 is the collection of computer software, hardware, and firmware that allows public cloud 305 to communicate through network 302.

VCEs can be stored as "images." A new active instance of the VCE can be instantiated from the image. Two types of VCEs may include virtual machines and containers. A container is a VCE that uses operating-system-level virtualization, in which the kernel allows the existence of multiple isolated user-space instances, called containers. These isolated user-space instances may behave as physical computers from the point of view of programs 350 running in them. An application 350 running on an operating system 322 can utilize all resources of that computer, such as connected devices, files and folders, network shares, CPU power, and quantifiable hardware capabilities. Applications 350 running inside a container of container set 344 may only use the contents of the container and devices assigned to the container, a feature which may be referred to as containerization.

Private cloud 306 may be similar to public cloud 305, except that the computing resources may only be available for use by a single enterprise. While private cloud 306 is depicted as being in communication with network 302 (such as the Internet), in other embodiments a private cloud 306 may be disconnected from the internet entirely and only accessible through a local/private network. A hybrid cloud may refer to a composition of multiple clouds of different types (for example, private, community or public cloud types), and the plurality of clouds may be implemented or operated by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 305 and private cloud 306 may be both part of a larger hybrid cloud environment.

What is claimed is:

1. A computer implemented method, the method comprising:
    receiving, by a processor, object data in real-time associated with an object in a real environment;
    generating one or more simulations in real-time associated with the object in the real environment using the object data;
    analyzing the one or more simulations to identify one or more potential issues associated with the object in the real environment; and
    deploying one or more smart devices to the object in the real environment to capture issue data associated the one or more potential issues of the object in the real environment.

2. The computer implemented method of claim 1, further comprising:
    analyzing the one or more potential issues and the object to determine whether the one or more potential issues are associated with an external component of the object; and
    deploying one or more external smart devices of the one or more smart devices to the external component of the object.

3. The computer implemented method of claim 1, further comprising:
    analyzing the one or more potential issues and the object to determine whether the one or more potential issues are associated with an internal component of the object; and
    activating one or more internal smart devices of the one or more smart devices associated with the internal component of the object.

4. The computer implemented method of claim 1, further comprising:
    analyzing issue data and a particular potential issue of the one or more potential issues of the object;
    identifying an object issue level for the particular potential issue; and
    determining whether the object issue level associated with the particular potential issue activates an issue threshold level.

5. The computer implemented method of claim 4, further including:
    determining the object issue level exceeds the issue threshold level;
    deploying an additional smart device to the particular potential issue of the object for an issue duration; and
    determining a cause of the particular potential issue.

6. The computer implemented method of claim 4, further including:
    determining the object issue level does not exceed the issue threshold level; and
    monitoring the one or more potential issues using the one or more smart devices.

7. The computer implemented method of claim 1, further comprising:
    analyzing the issue data associated with the object over a duration of time; and
    generating one or more recommendations, wherein the one or more recommendations are associated with a redesign of the object.

8. A system, the system comprising:

a memory; and a processor in communication with the memory, the processor being configured to perform operations comprising:

receiving object data in real-time associated with an object in a real environment;

generating one or more simulations in real-time associated with the object in the real environment using the object data;

analyzing the one or more simulations to identify one or more potential issues associated with the object in the real environment; and deploying one or more smart devices to the object in the real environment to capture issue data associated the one or more potential issues of the object in the real environment.

9. The system of claim 8, further comprising:

analyzing the one or more potential issues and the object to determine whether the one or more potential issues are associated with an external component of the object; and deploying one or more external smart devices of the one or more smart devices to the external component of the object.

10. The system of claim 8, further comprising:

analyzing the one or more potential issues and the object to determine whether the one or more potential issues are associated with an internal component of the object; and activating one or more internal smart devices of the one or more smart devices associated with the internal component of the object.

11. The system of claim 8, further comprising:

analyzing issue data and a particular potential issue of the one or more potential issues of the object;

identifying an object issue level for the particular potential issue; and determining whether the object issue level associated with the particular potential issue activates an issue threshold level.

12. The system of claim 11, further including:

determining the object issue level exceeds the issue threshold level;

deploying an additional smart device to the particular potential issue of the object for an issue duration; and determining a cause of the particular potential issue.

13. The system of claim 11, further including:

determining the object issue level does not exceed the issue threshold level; and monitoring the one or more potential issues using the one or more smart devices.

14. The system of claim 8, further comprising:

analyzing the issue data associated with the object over a duration of time; and generating one or more recommendations, wherein the one or more recommendations are associated with a redesign of the object.

15. A computer program product, the computer program product comprising a computer readable storage medium having program instructions embodied therewith, the program instructions executable by a processor to cause the processors to perform a function, the function comprising:

receiving object data in real-time associated with an object in a real environment;

generating one or more simulations in real-time associated with the object in the real environment using the object data;

analyzing the one or more simulations to identify one or more potential issues associated with the object in the real environment; and deploying one or more smart devices to the object in the real environment to capture issue data associated the one or more potential issues of the object in the real environment.

16. The computer program product of claim 15, further comprising:

analyzing the one or more potential issues and the object to determine whether the one or more potential issues are associated with an external component of the object; and deploying one or more external smart devices of the one or more smart devices to the external component of the object.

17. The computer program product of claim 15, further comprising:

analyzing the one or more potential issues and the object to determine whether the one or more potential issues are associated with an internal component of the object; and activating one or more internal smart devices of the one or more smart devices associated with the internal component of the object.

18. The computer program product of claim 15, further comprising:

analyzing issue data and a particular potential issue of the one or more potential issues of the object;

identifying an object issue level for the particular potential issue; and determining whether the object issue level associated with the particular potential issue activates an issue threshold level.

19. The computer program product of claim 18, further including:

determining the object issue level exceeds the issue threshold level;

deploying an additional smart device to the particular potential issue of the object for an issue duration; and determining a cause of the particular potential issue.

20. The computer program product of claim 15, further comprising:

analyzing the issue data associated with the object over a duration of time; and generating one or more recommendations, wherein the one or more recommendations are associated with a redesign of the object.

* * * * *